United States Patent [19]
Davis et al.

[11] Patent Number: 5,898,387
[45] Date of Patent: *Apr. 27, 1999

[54] MODULAR METER BASED UTILITY GATEWAY ENCLOSURE

[75] Inventors: Glenn A. Davis, Lilburn; David K. Walz, Stone Mountain, both of Ga.

[73] Assignee: Scientific-Atlanta, Inc., Norcross, Ga.

[*] Notice: This patent issued on a continued prosecution application filed under 37 CFR 1.53(d), and is subject to the twenty year patent term provisions of 35 U.S.C. 154(a)(2).

[21] Appl. No.: 08/824,433

[22] Filed: Mar. 26, 1997

[51] Int. Cl.⁶ ................................................ G08B 23/00
[52] U.S. Cl. ........................... 340/870.02; 340/870.03; 340/870.11; 340/637; 370/401; 379/106.03; 455/90
[58] Field of Search ................... 340/637, 870.02, 340/870.03, 870.06, 870.11, 825.06; 370/241, 401, 403; 395/200.8; 455/74, 90, 128, 556, 557; 379/106.01, 106.03

[56] References Cited

U.S. PATENT DOCUMENTS

| | | |
|---|---|---|
| 2,606,232 | 8/1952 | St. John . |
| 3,714,516 | 1/1973 | Howe . |
| 4,390,876 | 6/1983 | Bjorklund et al. . |
| 4,571,691 | 2/1986 | Kennon .............................. 340/545 |
| 4,977,482 | 12/1990 | Langdon et al. . |
| 5,018,192 | 5/1991 | Smith ................................. 379/106.3 |
| 5,430,430 | 7/1995 | Gilbert . |
| 5,477,216 | 12/1995 | Lee, Jr. et al. . |
| 5,491,473 | 2/1996 | Gilbert ............................... 340/870.01 |
| 5,572,438 | 11/1996 | Ehlers et al. ....................... 364/492 |
| 5,710,804 | 1/1998 | Bhame et al. ...................... 455/90 |

*Primary Examiner*—Michael Horabik
*Assistant Examiner*—Timothy Edwards, Jr.
*Attorney, Agent, or Firm*—Kenneth M. Massaroni; Hubert J. Barnhardt, III; Kelly A. Gardner

[57] ABSTRACT

A modular meter based utility gateway enclosure which resides between a power meter and a meter socket of a residence or other building supports multiple interchangeable local area network (LAN) and wide area network (WAN) interface cards. As a result, multiple LAN and WAN media are simultaneously and interchangeably supported by simply changing interface cards inserted into the slots of the enclosure. The modular meter based utility gateway enclosure includes a WAN card slot for accepting a WAN interface card, multiple LAN card slots for respectively accepting LAN interface cards, and a data bus for enabling communication between the WAN interface card and the LAN interface cards inserted into the WAN and LAN card slots respectively. The modular meter based utility gateway enclosure may also support one or more interdiction cards, and may further include a tamper proof mechanism to prevent unauthorized tampering with the enclosure.

14 Claims, 6 Drawing Sheets

MODULAR METER BASED UTILITY GATEWAY ENCLOSURE

FIELD OF THE INVENTION

The present invention relates to a modular meter based utility gateway enclosure which is installed between an electric meter and a corresponding meter socket of a residence or other building. The utility gateway enclosure simultaneously supports multiple interchangeable wide area network (WAN) and local area network (LAN) interface cards.

BACKGROUND OF THE INVENTION

Utility gateways provide access between a local area network (LAN) or in-home network communication medium and a wide area network (WAN) communication medium by bridging WAN communications onto the LAN or in-home network. LANs and in-home networks operate with communication protocols such as LonWorks™ and CEBus™. WANs operate using different communication protocols such as TDMA. A utility gateway enables LAN or in-home network communications sent by a subscriber in LAN or in-home protocol to be converted into a WAN protocol and transmitted over the WAN. Similarly, messages transmitted over the WAN are received, converted into an appropriate LAN or in-home protocol, and transmitted to the subscriber over the LAN or in-house network. Therefore, a utility gateway includes a component for receiving, processing and transmitting WAN-protocol packets, a component for receiving, processing and transmitting LAN or in-home network protocol data, and a bus connecting the WAN component to the LAN/in-home component.

To provide this bridging function, a utility gateway must have access to both the LAN and the WAN. Some currently available gateways are connected to the LAN or in-home network via the power supply and connected to the WAN via a coaxial cable. These currently available utility gateway enclosures are mounted on the side of the residence and must be wired to the in-home power supply line by an electrician. These utility gateway enclosures provide a bridge between a single WAN of a predetermined protocol and a single LAN or in-home network of a predetermined protocol. Thus, in the current utility gateway enclosures, the entire gateway enclosure must be changed if either the WAN or LAN protocol is changed. Moreover, current gateways do not provide simultaneous access to multiple types of LANs and in-home networks. Also, since these enclosures are connected to the power supply of the building, repair and upgrading of the gateway devices requires interruption of the power supply to the building.

SUMMARY OF THE INVENTION

In view of the drawbacks of the known utility gateway enclosures described above, the modular meter based utility gateway enclosure according to the present invention resides between an electric meter and a meter socket of a residence or other building. The utility gateway enclosure may be easily installed without an electrician by removably attaching a meter collar between the meter and the meter socket. Repair and upgrading of the utility gateway does not necessitate interruption of the power supply to the home or building because the electronics portion of the enclosure may be removed without removing the power meter itself. The utility gateway enclosure according to the present invention also accommodates multiple interchangeable local area network (LAN) interface cards and wide area network (WAN) interface cards, such that multiple in-home communications media are simultaneously supported and can be changed simply by inserting a different LAN or WAN interface card. As a result, multiple and interchangeable LAN and WAN media are supported by simply changing electronic cards inserted into the slots of the utility gateway enclosure. Moreover, the gateway enclosure according to the present invention simultaneously supports multiple LAN media.

A modular meter based utility gateway enclosure according to the present invention includes a WAN card slot for accepting a WAN interface card, a coupler for coupling the AN interface card to the WAN, multiple LAN card slots for respectively accepting LAN interface cards, couplers for respectively coupling the LAN interface cards to LANs or in-home networks, and a data bus for enabling communication between the WAN interface card and the LAN interface cards inserted into the WAN and LAN card slots respectively. The WAN card may optionally be positioned in a separate portion of the enclosure from the LAN cards to allow two different levels of access to the enclosure, one for the WAN provider and a higher security level for LAN access.

A modular meter based utility gateway according to the present invention includes a WAN interface card for receiving incoming data packets from a headend terminal and for transmitting outgoing data packets to the headend terminal; a plurality of LAN interface cards for receiving incoming communications from a downstream user terminal and for transmitting outgoing communications to the downstream user terminal; and a data bus for transmitting data between the WAN interface card and the plurality of LAN interface cards, thereby enabling communication between the headend terminal and the downstream user terminal via the WAN and LANs corresponding to said WAN and LAN interface cards.

WAN transmissions between the headend terminal and the utility gateway according to the present invention may be, for example, broadband, LLEO, VHF/Telephony, or radio frequency transmissions. LAN or in-home transmissions between the downstream user terminal and the utility gateway according to the present invention may be, for example, hardwired, radio frequency, CEBus PLC (power line connector), or Echleon PLC transmissions.

The modular meter based utility gateway enclosure according to the present invention may also include a tamper proof mechanism to prevent unauthorized tampering with the enclosure.

The utility gateway enclosure according to the present invention may also support one or more interdiction cards in place of or in addition to the WAN and LAN cards supported by the utility gateway enclosure.

A method of assigning an in-home device to a modular meter-based utility gateway according to the present invention includes the steps of scanning a first optical identification code associated with an in-home device; scanning a second optical identification code associated with a meter-based utility gateway; downloading the first and second optical identification codes to a computer via a two-way link; and transmitting programming commands from the computer to the meter-based utility gateway, thereby assigning the in-home device to the meter-based utility gateway.

Various additional advantages and features of novelty which characterize the invention are further pointed out in the claims that follow. However, for a better understanding of the invention and its advantages, reference should be made to the accompanying drawings and descriptive matter which illustrate and describe preferred embodiments of the invention.

DETAILED DESCRIPTION

The present invention will now be described with reference to the accompanying drawings.

Figure 1:
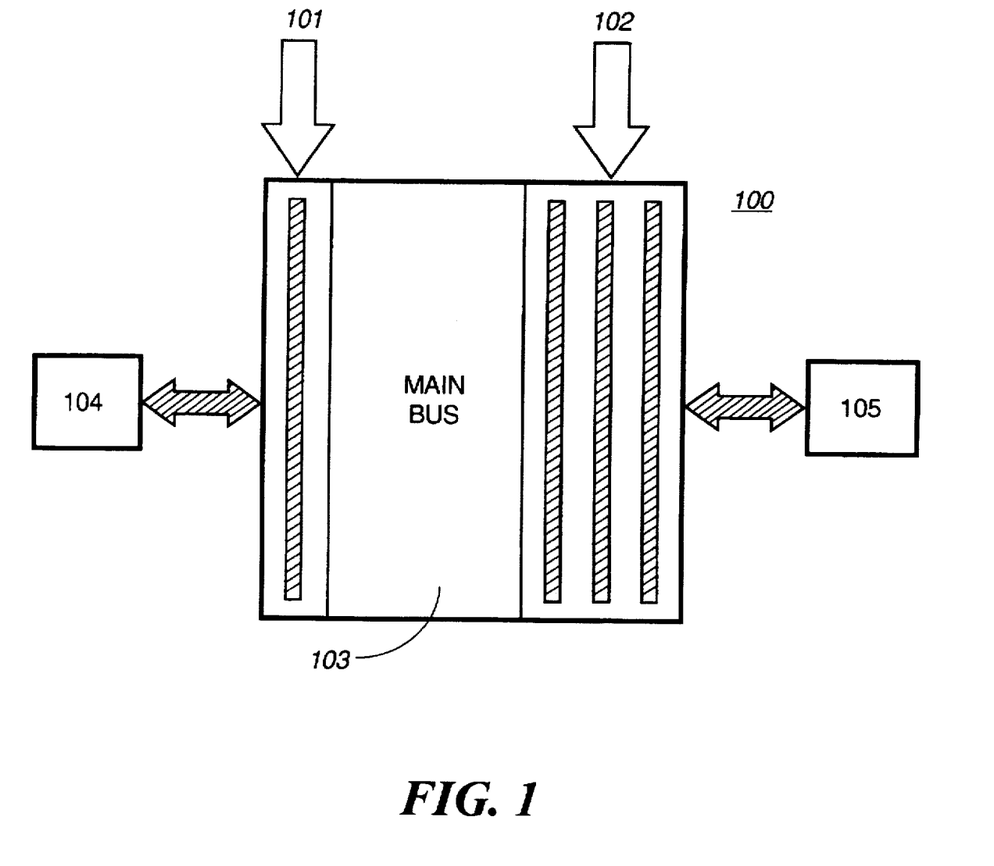
FIG. 1 provides a block diagram of the components of a modular meter based utility gateway according to the present invention.

With reference to FIG. 1, a modular meter based utility gateway 100 according to the present invention includes a wide area network (WAN) interface card 101, three local area network (LAN) or in-home network interface cards 102, and a main bus 103. The WAN interface card 101 receives information from and transmits information to a remote headend 104. The LAN/in-home network interface cards 102 transmits information to and receives information from a subscriber terminal 105. Information is transmitted between the WAN card 101 and LAN/in-home cards 102 by main bus 103.

The headend 104 which communicates with the WAN card 101 configures the downstream flow of data over the network to a plurality of subscriber sites, each having a modular meter-based utility gateway enclosure according to the present invention. The headend 104 may be, for example, a resident database containing control algorithms to route and store data for the applications of each subscriber terminal 105. In functioning as a database, the headend 104 contains subscriber records and data in its files and provides other applications with data on request. In an exemplary embodiment of the present invention, the headend 104 can accommodate 65,000 sites in broadband.

The system supports multiple WAN forms including, but not limited to, coaxial, fiber and hybrid fiber coaxial (MFC) broadband, RF, telephony, and satellite (e.g., low-earth orbit (LEO) and little LEO (LLEO)).

According to an HFC broadband embodiment of the present invention, when a data packet is to be sent by broadband, the headend 104 encapsulates the data packet with header information and CRC error detection bits and then places the data packet into a network TDMA scheme using time slots for communication. The packets are then sent by the headend 104 to the utility gateway 100 and received by the WAN card 101. The WAN architecture may be designed to support asynchronous transfer mode (ATM) transport with UDP/IP (user datagram protocol/Internet protocol) type addressing on the cable system. TDMA addressing is preferred. The TDMA transport is used primarily, on a dynamically allocated basis, for routing message traffic and for file transport facilities.

The data packet is then transmitted from the headend 104 to the utility gateway 100 via a hybrid fiber-optic coaxial (HFC) network. The HFC network may be a utility non-application specific, meaning no special modifications are required to provide utility applications. This is a feature common to all the WANs utilized. The typical architecture of an HFC network includes a number of fiber nodes that receive and convert optical signals to electrical signals, and drive two-way signals onto the coaxial plant. In an illustrative embodiment, a fiber node can serve between 500 and 2000 homes. From the node, a coaxial distribution network carries signals to subscribers' homes. Along the distribution network, the utility gateways 100 are connected to provide the final link to the utility application in-home. According to this exemplary embodiment, data may be transported at 125 kbps using FSK modulation. This approach permits apparent asynchronous communication, file transfer activities, Internet access and other modem functions, and shareable channel with other services in TDMA. In another broadband embodiment, data may be transported at T1 speed with a 1 MHZ bandwidth in the forward and reverse directions (1.5 Mbps). QPSK modulation may be used for robust data communications and high bandwidth efficiency.

Other WANs can be used in the gateway of FIG. 1. For example, when the data packet is sent by radio frequency (RF) such as at very high frequency (VHF) or via telephony, a VHF/telephony media access controller (VTMAC) receives and transmits the data packet. Thereafter, if the data packet contains an unscheduled message, it is distributed by RF and sent to a radio tower which broadcasts the information over the RF network to gateway 100. Otherwise, the data packet is put onto the telephone network phone lines and sent to the utility gateway 100. According to this exemplary configuration, the VTMAC can control data transport so that unscheduled messages can be transported via the RF network while scheduled transactions and gateway return communications can be transported via the telephone network.

If the data packet is to be distributed via satellite, a little LEO (LLEO) media access controller (LLMAC) receives and communicates the data packet over the phone lines to a LLEO service provider that broadcasts the information over a satellite network to the utility gateway 100. This functionality is described in U.S. patent application Ser. No. 08/604,784, filed Feb. 23, 1996 and entitled "Method and Apparatus for Command and Control of Remote Systems Using Low Orbit Satellite Communications," which is incorporated herein by reference.

In the exemplary broadband implementation of the gateway 100 described above, the WAN card 101 may include an FSK transceiver if the modulation technique at the headend is FSK. Also, the WAN card 101 provides control for the TDMA transport scheme using a microprocessor. The microprocessor can receive messages, check CRC and address information, perform TDMA decoding, clocking, bus interface and memory management. The microprocessor also manages the TDMA transmitter in response to the embedded clock signals in the downstream data packets. The microprocessor may be an 80C51XA made by Philips Electronics or in the Motorola 68000 family with internal ROM, RAM and EEROM.

According to another exemplary broadband implementation of the gateway 100, the WAN card 101 may include a QPSK transceiver if the headend uses QPSK modulation. Some of the functions which may be embedded in this illustrative WAN interface include ATM filtering, IP filtering, TDMA control, CRC calculator, 68000 type or 80C51XA microcontroller, and bus controller and LAN interface drivers. External ROM may be used to support program control of the WAN communications interface. An external RAM can provide temporary storage of data. An external EEROM may be provided for permanent storage for media access control (MAC) address and other permanent or semi-permanent data. The microcontroller manages slotted Aloha transmission and the TDMA transport scheme.

The WAN card 101 demodulates the data packet and removes the header including routing and control information from the packet put on by the MAC. The WAN card 101 sends the data over main bus 103 to an appropriate LAN interface 102 which translates and removes the protocol and recovers the native message when the gateway 100 is instructed to listen and pass the native message to the in-home device 105. The protocol removed includes PTID, PID, GPPD, and SessionID.

In the illustrative embodiment of FIG. 1, three LAN interface cards are provided. However, any number of LAN interfaces may be provided. As a result of the multiple LAN card slots provided by the enclosure according to the present invention, when a new application is implemented by a subscriber, the LAN interface corresponding to the new application is simply inserted into the enclosure. Since the LAN interfaces can be plug-in cards, replacement and addition of LAN interfaces is relatively easy. Exemplary LAN interfaces may include a LonWorks™ interface, CEBus™ interface, hardwired interface, RF interface, an RS-232 interface, or a broadband modem. LonWorks™ and CEBus™ are specific protocol designed for power line carrier communications.

The LonWorks™ interface is designed to provide Echelon power line carrier communications for the home LAN. The interface includes a microprocessor which is responsible for bus interface and protocol translations. The microprocessor may be a Neuron chip by Motorola. The Neuron chip receives standard LonWorks™ protocol to be inserted on the power lines. The data is routed to an Echelon PLT 21 communications device and inserted on the power wiring through a coupling network and external wiring. The Neuron chip handles data transport issues including collisions and delivers the requested data to the microprocessor when available. The microprocessor then presents data to the WAN card 101 via the main bus 103 for communications to the MAC or other application as directed by routing (mapping) tables in the WAN card 101. In some instances, gateway 100 may have intelligence such as in a narrowband implementation or in broadband if intelligent gateway and be able to directly rout information elsewhere, for example to a nearby load control device.

The CEBus™ interface provides CEBus™ power line carrier communications for the home LAN. The microprocessor may be in the 68000 family or a Philips 80C51XA and interface with a CEBus™ communications device which inserts the data on the power wiring through a coupling network and external wiring. The microprocessor handles data transport issues including collisions and delivers the requested data to the WAN card 101 via the common bus 103 for communications to the MAC or other application as directed by routing (mapping) tables in the WAN interface card 101.

The hardwired interface is provided for applications such as low cost scenarios. This interface provides for a pulse initiator and maintains an accumulator function with an EEROM type memory and long term battery support. The interface takes input from devices such as electric, gas, and water meters.

The RF interface provides wireless communications for devices in and around the home such as electric, gas, and water meters, and appliances.

An RS-232 interface can support services such as local narrowband nodes. The RS-232 interface may extract data files from a local host system on command. This permits the transfer of large data files.

A broadband modem may share the utility data communications channel for the purpose of Internet access and other computer type services. Rapid access to file servers providing access to a variety of services can be realized.

A native message is transmitted upstream from the in-home device 105 to the applications platforms over the same mediums. The in-home device 105 passes the native message to its corresponding LAN interface card (one of LAN cards 102). The LAN interface adds the protocol to the native message and passes the data packet with the protocol and native message to the WAN interface card 101 via the bus 103. The WAN interface card 101 encapsulates the data packet by adding a header and transmits the information upstream from the gateway 100 over the appropriate WAN to the headend. For example, the gateway 100 can transmit the information over the HFC network to the headend 104 at a rate to 125 kbps. At the headend, the demodulator portion of broadband modem 30 demodulates the upstream data packet from a 125 kbps FSK modulated NRZ signal to a 115.2 kbps baseband NRZ signal.

Additional details concerning the operation of the headend and the formatting of information transmitted between the headend 104 and the gateway 100 are provided in copending U.S. patent application Ser. No. 08/751,946, entitled "Method and Apparatus for Communicating Information Between a Headend and Subscriber over a Wide Area Network," filed on Nov. 19, 1996, and incorporated herein by reference.

In an alternative embodiment, the meter-based utility gateway enclosure according to the present invention may also be configured to receive one or more interdiction cards in addition to or in place of one or more of the LAN and WAN cards within the enclosure. These interdiction cards are custom-designed to operate with the WAN/LAN protocols and main bus protocols (described in detail below) of the gateway and enable the jamming of unauthorized user services.

The main bus 103 transmits data and control information between the WAN card 101 and the LAN cards 102. The main bus 103 may be a backplane bus which supports a data transfer rate of up to 20,000 bps and provides flow control in both directions using a small number of microprocessor I/O pins.

According to one embodiment of the present invention, the WAN card 101 acts as the bus master and the LAN cards are the bus slaves. Each gateway 100 has one master slot and up to three slave slots. The master coordinates use of the bus and participates in all packet transfers. In order for one slave to send a packet to another slave, the master must perform a relay function.

The basic bus transaction is a packet transfer from master to slave, slave to master, or both. The master initiates all bus transactions, and therefore must continuously poll all slaves to provide the opportunity for the slaves to transfer packets to the master. During periods when there is no data transfer between the master and slaves, bus transactions end quickly without any packet transfer taking place.

All bus signals are pulled up to +5V by 10K pullup resistors on the backplane card. Examples of lines that are driven by the master may be card select (CS), data input (DIN), clock (CLK), and reset (RST). Examples of lines driven by the slaves are data output (DOUT) and handshake (HS).

Regarding the card selection (CS) operation, there is a dedicated CS line for each slave slot. All three lines converge on the master slot, whereas each slave sees only a single CS line which is dependent upon the slot the slave card occupies. The purpose of the CS line is to select one slave for a bus transaction. The master holds the CS line to the selected slave for the duration of the transaction.

The data input (DIN) signal carries data from the master to the currently selected slave.

The data output (DOUT) signals carries data from the currently selected slave to the master.

The clock (CLK) signal is driven by the master. The master toggles CLK to indicate that it has made the next bit available on DIN or accepted the current bit on DOUT.

The handshake (HS) signal is driven by the currently selected slave. The slave toggles HS to indicate that it has accepted the current bit on DIN or made the next bit available on DOUT.

The reset (RST) signal is driven by the master and provides an active-low hardware reset signal to all slaves.

Byte transfers across the main bus 103 between the master WAN interface card 101 and the slave LAN interface cards 102 will now be described in detail. A bus transaction consists of many individual byte transfers in both directions (master to slave and slave to master). Bytes are sent across the serial bus most-significant bit first. In one exemplary configuration, bit 7 is selected as the most significant bit and bit 0 is selected as the least significant bit.

In master to slave transfers, both CLK and HS are initially high. The master puts bit 7 on DIN and lowers CLK. The slave reads the DIN bit (bit 7) and lowers HS. The master puts bit 6 on DIN and raises CLK. The slave reads bit 6 and raises HS. This process repeats until all eight bits have been transferred from the master to the slave.

In slave to master transfers, both CLK and HS are initially high. The slave puts bit 7 on DOUT and lowers HS. The master reads the DOUT bit (bit 7) and lowers CLK. The slave puts bit 6 on DOUT and raises HS. The master reads bit 6 and raises CLK. This process repeats until all eight bits have been transferred from the slave to the master.

During byte transfers, each time the master toggles CLK, it waits up to 100 μs for the slave to respond by toggling HS. If the slave does not respond in that period of time, the master resynchronizes the bus 103 as described below. By contrast, the slaves do not have such timeouts and wait indefinitely for the master to toggle CLK or to resynchronize the bus 103.

The master (WAN card 101, e.g.) can resynchronize the bus 103 (return it to its initial state) by bringing all CS lines high for 200 μs or longer. All slaves recognize the loss of CS within 200 μs, terminate any bus transactions in progress, cease driving any output lines (DOUT and/or HS), and reset their bus interfaces to the initial state. The initial state is the idle state between bus transactions (no transaction in progress). To enable the bus to be resynchronized in this fashion, the slaves check the state of their respective CS line at least once every 100 μs.

If bus resynchronization fails (for example, if DOUT and/or HS do not return to a high level within the 200 μs), the master can reset all slave boards by driving RST low for 100 μs or longer. A reset pulse of 100 μs shall be sufficient to cause a hardware reset of all slaves.

The master detects the presence of slaves (LAN cards 102) within the slave slots through a polling function. The master initially assumes that all slots are full and polls the slots. If no slave answers the poll in a specific slot, the transaction will time out. Three consecutive timeouts will remove the slave slot from the master's normal polling sequence. At least once every 10 seconds, the master re-polls all slaves which have been removed from the polling sequence and adds slaves which respond to the poll back into its normal polling sequence.

The bus protocol will now be described in detail. All transactions start with the master selecting a slave by lowering the respective CS line and holding it low for the entire duration of the transaction. The master may abort the transaction at any time by raising the CS line, after which it must hold all CS lines high for 200 μs before starting another transaction.

After lowering the CS line, the master sends a control byte to the selected slave in the following format including MEXT (master control byte extension), MDA (master data available), and MRR (master ready to receive) bits:

| bit 7 | bit 6 | bit 5 | bit 4 | bit 3 | bit 2 | bit 1 | bit 0 |
|---|---|---|---|---|---|---|---|
| MEXT | unused | unused | unused | unused | unused | MDA | MRR |

MDA=1 indicates that the master wants to send a data packet to the slave. MRR=1 indicates that the master is prepared to receive a data packet from the slave. MEXT=1 indicates that additional control bytes are to follow, as described in more detail below. The master sets all unused bits to 0, and the slave ignores them.

If the MEXT bit is set in the control byte, the master sends one or more additional control bytes including MARG (master command argument present) and MCMD (master command code) bits in the following format:

| bit 7 | bit 6 | bit 5 | bit 4 | bit 3 | bit 2 | bit 1 | bit 0 |
|---|---|---|---|---|---|---|---|
| MARG | MCMD | — | — | — | — | — | — |

MARG=1 indicates that additional argument bytes are to follow. The first such byte, MLEN, indicates the number of additional byte arguments. This number does not include the MLEN byte itself. If the slave does not recognize the command code sent by the master, it can still parse the byte stream and skip over any byte arguments.

The lower seven bits of this byte form a command code which allows for primitive communication between the master and slaves even if normal byte transfer is not possible for some reason. An exemplary set of command codes is provided below.

Master Command Codes:

1) Peripheral Identification (PID) Request:
    Command code: 00 hex
    Arguments: none
    This command asks the slave to send its list back to the master.

2) Priority Message Pending:
Command code: 01 hex
Arguments: none

This command indicates that a priority message is pending in the master-to-slave direction.

This command is issued only if delivery of the priority message was blocked on some number of previous attempts due to SRR=0. On receipt of this command, the slave takes action to clear its buffers to facilitate delivery of the message.

Upon receipt of a master control byte, the recipient slave generates and sends back a similar control byte including SEXT (slave control byte extension), SRR (slave ready to receive), and SDA (slave data available) bits in the following format:

| bit 7 | bit 6 | bit 5 | bit 4 | bit 3 | bit 2 | bit 1 | bit 0 |
|-------|-------|-------|-------|-------|-------|-------|-------|
| SEXT | unused | unused | unused | unused | unused | SDA | SRR |

SDA=1 indicates that the slave wants to send a package to the master. SRR=1 indicates that the slave is prepared to receive a data packet from the master. SEXT=1 indicates that additional control bytes are to follow, as described below. The slave sets all unused bits to 0, and the master ignores them.

If the SEXT bit is set in the slave control byte, the slave then sends one or more additional control bytes including SARG (slave command argument present) and SRPS (slave response code) in the following format:

| bit 7 | bit 6 | bit 5 | bit 4 | bit 3 | bit 2 | bit 1 | bit 0 |
|-------|-------|-------|-------|-------|-------|-------|-------|
| SARG | SRPS | — | — | — | — | — | — |

SARG=1 indicates that additional argument bytes are to follow. The first such byte, SLEN, indicates the number of additional argument bytes, excluding the SLEN byte itself Exemplary slave command codes include:
1) PID Response
Command code: 00 hex
Arguments: list This response code is sent in response to a request by the master. The list for the slave is sent in the byte arguments. As for any command or response with arguments, the first argument byte is a count of the number of additional argument bytes (in this case, codes) to follow.

2) Priority Message Pending
Command code: 01 hex
Arguments: none

This command indicates that a priority message is pending in the slave-to-master direction.

This command is issued only if delivery of the priority message was blocked on some number of previous attempts due to MRR=0. On receipt of this command, the master takes action to clear its buffers to facilitate delivery of the message.

3) Command Error
Command code: 02 hex
Arguments: none

The slave issues this command code when it receives a command code from the master that it does not recognize. There is no equivalent code in the master-slave direction, as the master ignores commands it does not recognize.

Once the master and slave have exchanged control bytes as described above, both sides perform the following negotiation algorithm to determine what packet transfer(s) will take place:

If AFDA=1 and SRR=1, then a packet shall be transferred from the master to the slave.
If SDA=1 and MRR=1, then a packet shall be transferred from the slave to the master.

The algorithm is implemented by ANDing the two control bytes together. Once the negotiation is completed, either the master or the slave commences packet transfer to the other.

The packet format consists of a fixed-size header containing a length byte followed by a variable-sized data block. The data block can be up to 64 bytes in length.

At the end of each bus transaction, the master sends an end of transmission (EOT) byte to the slave. The EOT byte is, for example, a hex 55 command code (chosen so that DIN will end up high). The master then raises CS, ensures that DOUT and HS are high, and selects another slave for the next transaction. Alternatively, the master may commence another transaction with the same slave by leaving CS low and sending the control byte for the next transaction.

If a slave becomes busy for an extended period of time and does not service its bus interface, bus transfers to other slaves may be blocked. To avoid this situation, the slave is designed to always service its bus interface at a minimal level, sufficient to respond to the polls, even if it is unable to continue with packet transfers. However, in some cases this is not possible.

Therefore, to avoid the blocking of bus transfers to other slaves, a slave may indicate a busy status to the master which prevents the master from attempting transactions with the busy slave. This may be accomplished by bringing DOUT low within 1 μs after the slave's CS line goes low. Thus, after a master selects a slave by bringing the CS line to the slave to a low state, it delays for 1 μs and then checks DOUT. If DOUT is high, it commences the bus transfer to the slave. If DOUT is low, the master deselects the slave, waits for DOUT to return to a high level, and selects another slave.

To implement this feature whereby DOUT is set to a low state by the slave, an external DOUT driver is provided, thus enabling the slave's microprocessor to set DOUT at a low level when it is busy. The external driver ensures that this operation does not affect the actual DOUT bus line except when the slave card is selected (CS is low).

To assert busy status, a slave must bring DOUT low before the EOT byte transfer is complete. This prevents the master from initiating another bus transaction with the same slave. In general, the master must check DOUT for a slave busy indication before every bus transaction. Slaves that do not wish to assert a busy status must bring DOUT high before the EOT byte transfer is complete.

According to one embodiment of the present invention, each slave is not required to provide any setup time for DOUT before toggling HS. The DOUT line is allowed a period of 100 μs to stabilize after the HS edge occurs. Consequently, the master must delay sampling of DOUT for at least 100 μs after the HS edge occurs. This may be accomplished by software implementations in the master, provided HS and DOUT are not sampled in the same instruction.

Figure 2:
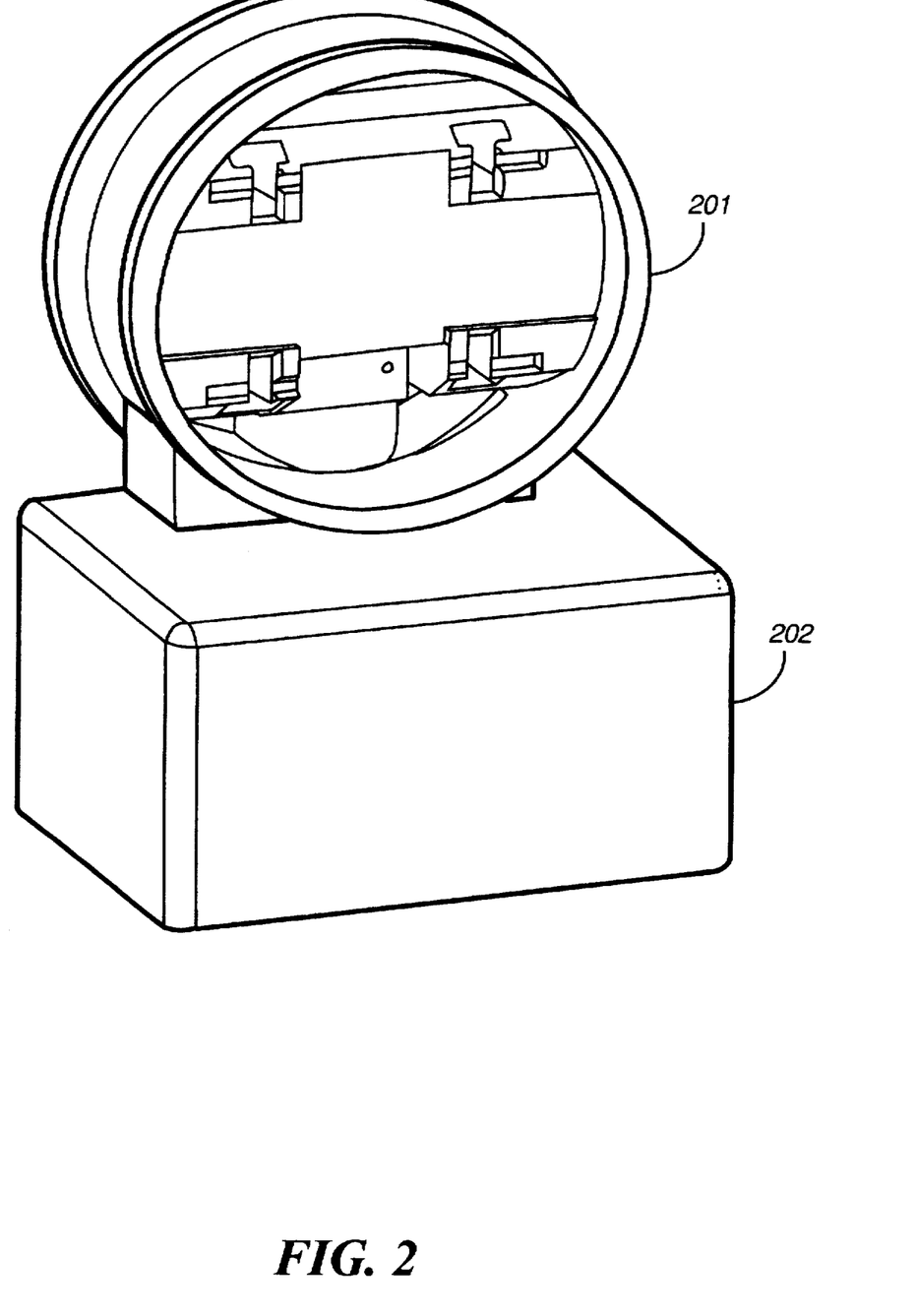
FIG. 2 provides an illustration of the external appearance of a modular meter based utility gateway enclosure for housing the gateway shown in FIG. 1.

With reference to FIG. 2, the utility gateway 100 described with reference to FIG. 1 may be implemented within the system by attaching the gateway 100 within an enclosure or electronics bay 202 which is attached to a power meter collar 201. The power meter collar 201 couples a power meter (not shown) of a residence or other building to the meter bay (not shown) of the residence or building.

Figure 3:
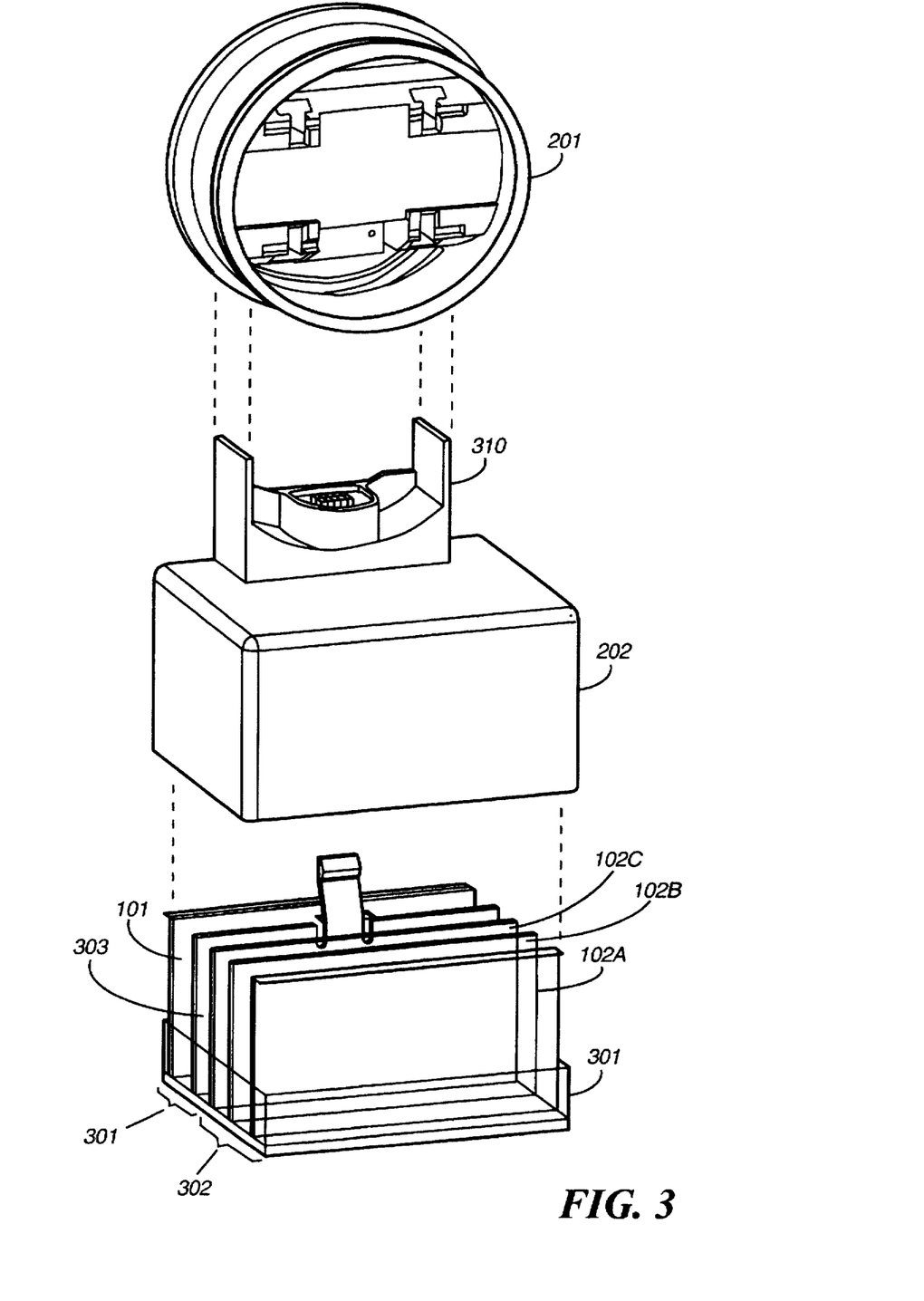
FIG. 3 provides an illustration of the arrangement of the components of the utility gateway of FIG. 1 within the modular meter based utility gateway enclosure shown in FIG. 2, including a meter socket collar, an external utility gateway enclosure or electronics bay, and an internal arrangement of the electronics bay including inserted WAN and LAN cards.

FIG. 3 provides an illustration of the positioning of the WAN card 101, LAN cards 102, and main bus 103 within the modular meter based utility gateway electronics bay 202 shown in FIG. 2. WAN card 101 is positioned within a first chamber 301 of the electronics bay 202, and LAN cards 102a, 102b, and 102c are positioned in a second chamber 302 of the electronics bay 202 to isolate the LAN cards 102a–c from radio-frequency interference caused by RF operation of the WAN card 101. A partition 303 separates the first chamber 301 from the second chamber 302.

The first and second chambers 301 and 302 may optionally be accessed by two different panels, thereby allowing for two levels of access, one for the WAN service provider and the other for the LAN service provider. As a result, the WAN service provider is only able to access the WAN card in the first chamber 310, and the LAN service provider(s) is be able to access both the first and second chambers 301 and 302.

To install the enclosure according to the present invention, the back portion of the meter collar 201 is snapped into the meter bay (not shown) of the residence or building, the meter pan lid is closed, and the power meter (not shown) is attached to the front of the meter collar 201. The electronics bay 202 is then connected to the meter collar 201 by connector 310. Connector 310 provides access from the gateway 100 to the power supply of the residence or building. According to one embodiment, the meter collar 201 may be configured to provide a power cut-off switch to cut off power to, and thereby disable, the gateway 100 in electronics bay 202.

According to one embodiment of the utility gateway enclosure according to the present invention, tamper-resistant mechanisms and/or tamper detection mechanisms may be installed with the enclosure. Tamper-resistant mechanisms may be, for example, padlocks (not shown) provided on meter rings (not shown) used to hold both the enclosure and the meter in place. A tamper detection mechanism may be, e.g., a low-impedance current coil which is connected across the power meter when the gateway is plugged into the power meter. While the gateway is coupled to the power meter, the voltage drop across the power meter is relatively small as a result of the presence of the current coil. When the gateway is uncoupled from the power meter, the current coil is disconnected, resulting in a substantial increase in the voltage across the power meter. This increase in voltage may be monitored, for example, by an optocoupler which senses the voltage across the power meter and provides sensor readings to a microprocessor. In turn, the microprocessor initiates communication with a headend or other monitoring station to indicate that the gateway has been tampered with (i.e., uncoupled from the power meter).

Figure 4:
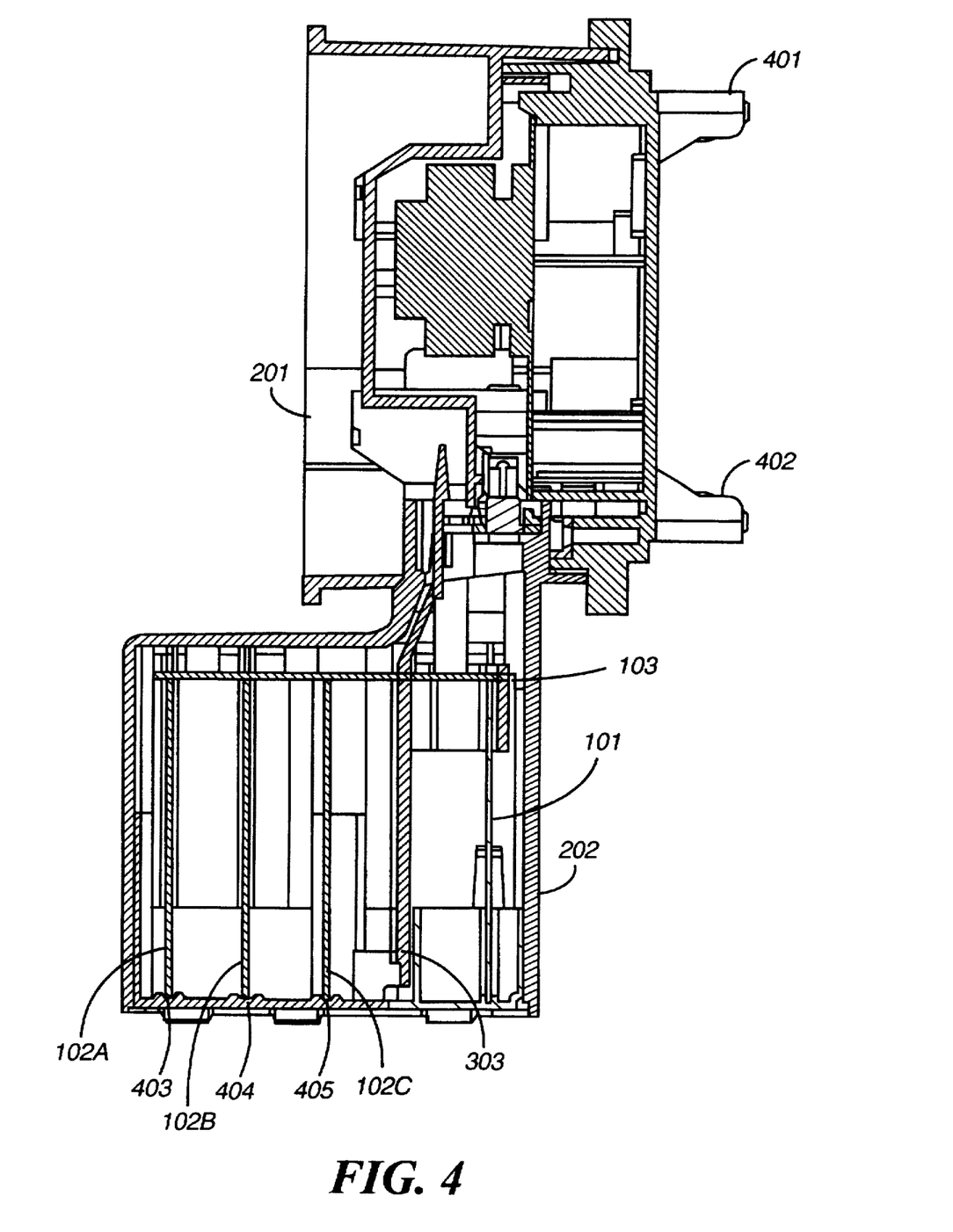
FIG. 4 provides a side diagram of the electronics bay 202 illustrated in FIG. 3.

FIG. 4 provides a side diagram of the electronics bay 301 illustrated in FIG. 3. The meter collar 201 includes prongs 401 and 402 for insertion into the meter bay (not shown). Within the electronics bay 202, LAN cards 102a–c are positioned in three slots 403, 404, and 405 and isolated from WAN card 101 by partition 303. The main bus 103 is coupled to the LAN and WAN cards and penetrates the partition 303.

Figure 5:
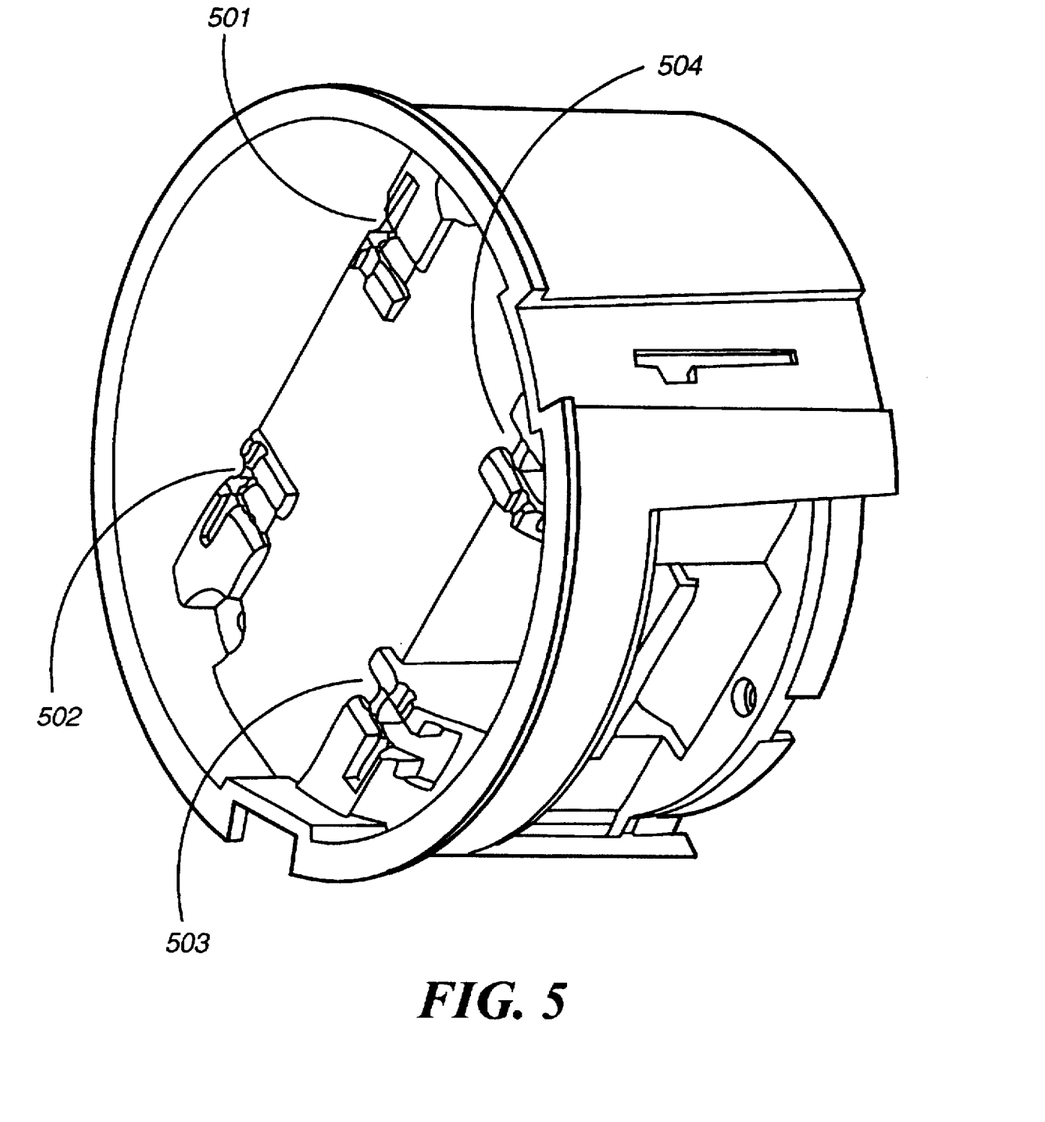
FIG. 5 provides an illustration of the meter socket collar used to couple the utility gateway enclosure according to the present invention to a conventional power meter.

FIG. 5 provides an illustration of the collar meter socket 201 used to couple the utility gateway enclosure according to the present invention to a conventional power meter (not shown). A conventional meter is attached to prongs 501–504. The prongs 401 and 402 (see FIG. 4) on the opposite side of the collar are attached to the meter bay (not shown).

Figure 6:
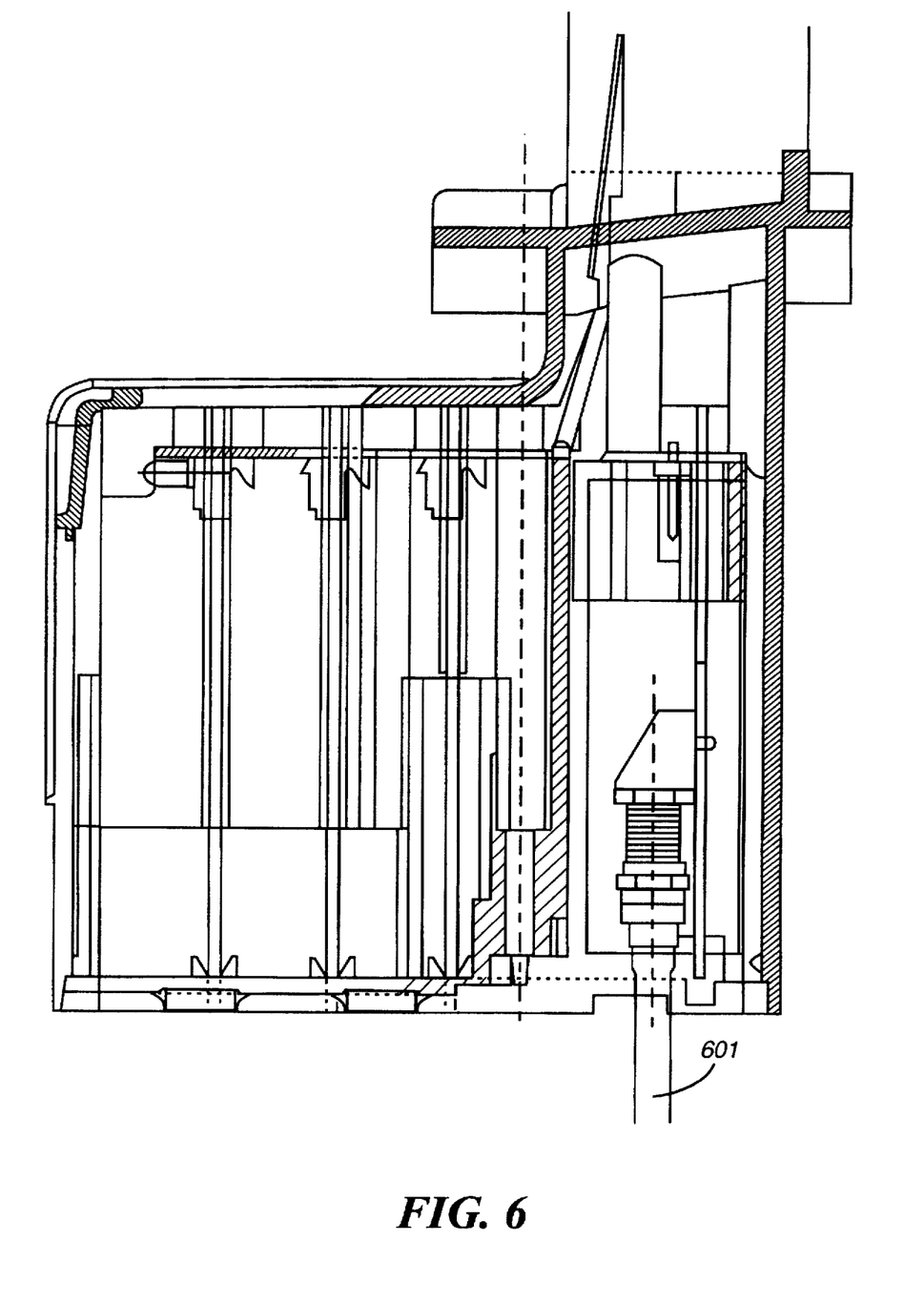
FIG. 6 provides a side diagram of the electronics bay 202 including a coaxial cable attachment.

FIG. 6 provides a side diagram of the electronics bay 301 including the features described above with reference to FIG. 4. A coaxial cable attachment 601 is also illustrated. This attachment provides a connection between the gateway 100 and the HFC network.

The modular meter-based utility gateway enclosure according to the present invention may be configured using, e.g., a two-way infrared (I/R) link for performing local set-up, diagnostics, and in-home device testing without opening the enclosure. Since the gateway according to the present invention is designed to operate within multiple WANs and LANs/in-home networks, installation of the gateway enclosure requires programming of the gateway to assign to the gateway the particular in-home devices (personal computers, etc.) which are to communicate through the gateway. This assignment may be performed, for example, by optically scanning the bar codes associated with each in-home device, scanning the gateway identification code, and then downloading this information to a computer via a two-way optical (I/R) link. The computer then sends programming commands to the gateway and may also initiate a communications link with a headend or other monitoring station to signal the assignment of the in-home devices to the gateway. In this way, each gateway within the system may be easily and efficiently configured.

The modular meter-based utility gateway enclosure according to the present invention is capable of supporting basic applications such as automatic meter reading, service connect and disconnect, tamper detection, outage detection, customer-controlled load management, and real-time pricing. In addition, the communications infrastructure allow for the addition of enhanced services, security monitoring, telephony, entertainment, and other interactive services in the future.

According to one embodiment of the present invention, the above-described features are facilitated by host applications that reside at the utility connected to a WAN via the utility gateway enclosure. The applications are tied to a network management controller that routes the downstream data flow of data and populates applications with data on request. A media access controller for scheduling and coordinating all messages on a forward and/or reverse path for any media used by the system encodes and decodes signals sent between the customer and the utility over the utility's preferred network infrastructure. The gateway also facilitates communications from the WAN to the LAN. The utility gateway supports an open architecture, such that many types of vendors may easily supply applications to operate over the network.

The function of automatic meter reading may be provided through pulse initiator meter modules, integrated into the gateway, and applications software to support the modules. Each meter module or Echelon/CEBus-compatible meter counts and delivers kilowatt hours for single phase meters. The systems stores meter readings for at least six different levels so as to support real-time pricing. The application may read a single meter on demand from the user and respond in a short period of time such as under 60 seconds; store all meter data for a large population of meters; and provide high-speed data transfer to authorized users, both inside and outside the utility, to facilitate billing and other control functions.

The function of two-way management and real-time pricing may be provided through software applications. End-user devices, defined as a two-way load management switch or a home user interface, is located at the customer site and responds to commands generated by the two-way load management and real-time pricing application.

The function of outage notification may be provided as part of a network diagnostics program. The system supports outages detected by the network controller, for example, when a gateway fails to respond to a poll.

The remote service connect/disconnect function may be provided as part of the gateway enclosure. A contactor within the enclosure incorporates a hard-wired link to the gateway, such that only a driver circuit is required to activate and deactivate the contactor upon receipt of the appropriate command from the service reconnect system application.

While particular embodiments of the present invention have been described and illustrated, it should be understood that the invention is not limited thereto since modifications may be made by persons skilled in the art. The present application contemplates any and all modifications that fall within the spirit and scope of the underlying invention disclosed and claimed herein.

We claim:

1. A modular meter-based utility gateway enclosure, comprising: a removable wide area network (WAN) interface card for communicating with a headend device via a WAN, said WAN employing a WAN protocol;

a plurality of removable local area network (LAN) interface cards for communicating with devices on a plurality of LANs, each of said LAN interface cards being connected to one of said plurality of LANs, each of said LANs employing a corresponding LAN protocol; and a data bus for transferring data between said WAN interface card and said plurality of LAN interface cards, said WAN interface card being operative to:
receive data from said headend via said WAN, said data including a header and native information;
determine which of said LAN interface cards should receive said data; and
transfer said data to one of said LAN interface cards via said data bus, said LAN interface cards being operative to:
receive said data from WAN interface card;
translate said data to recover said native information; and
transfer said native information to one of said devices on said corresponding LAN.

2. The modular meter-based utility gateway enclosure of claim 1, wherein said enclosure is removably coupled to a power meter via a meter collar.

3. The modular meter-based utility gateway enclosure of claim 1, wherein said data transmitted via said WAN protocol is transmitted via broadband, LLEO, VHF/telephony, or radio frequency transmissions.

4. The modular meter-based utility gateway enclosure of claim 1, wherein said data transmitted via said LAN protocol is transmitted via hard wired, radio frequency, CEBus PLC, or Echelon PLC transmissions.

5. The modular meter-based utility gateway enclosure of claim 1, wherein said WAN interface card comprises a master microprocessor and said LAN interface cards comprise slave microprocessors, and said master microprocessor controls communications between said WAN interface card and said LAN interface cards via said data bus.

6. The modular meter-based utility gateway enclosure of claim 1, further comprising an interdiction card slot for supporting a removable interdiction card.

7. The modular meter-based utility gateway enclosure of claim 1, wherein said WAN interface card is enclosed in a first chamber having a first chamber access mechanism and said LAN interfaces cards are enclosed in a second chamber having a second chamber access mechanism.

8. The modular meter-based utility gateway enclosure of claim 7, wherein said first chamber access mechanism provides a first level of security for access to said first chamber and said second chamber provides a second level of security for access to said second chamber.

9. A modular meter-based utility gateway, comprising:

a removable wide area network (WAN) interface card for receiving incoming data packets from a headend terminal and for transmitting outgoing data packets to said headend terminal over a WAN, said WAN employing a WAN protocol;

a plurality of removable local area network (LAN) interface cards for receiving incoming communications from downstream user terminals and for transmitting outgoing communications to said downstream users terminal via LANs corresponding to each of said LAN interface cards, each of said LANs employing a corresponding LAN protocol; and a data bus for transferring data between said WAN interface card and said plurality of LAN interface cards, thereby enabling the transfer of data between said headend terminal and said downstream user terminals, said WAN interface card being operative to:
receive said incoming data packets from said headend terminal via said WAN, said incoming data packets including a header and native information;
determine which of said LAN interface cards should receive said data packet; and
transfer said data packet to one of said LAN interface cards via said data bus, and said LAN interface cards being operative to:
receive said data packet from WAN interface card;
translate said data packet to recover said native information; and
transfer said native information to one of said downstream user terminals on said corresponding LAN.

10. The modular meter-based utility gateway of claim 9, wherein said data transmitted via said WAN protocol is transmitted via broadband, LLEO, VHF/telephony, or radio frequency transmissions.

11. The modular meter-based utility gateway of claim 9, wherein said data transmitted via said LAN protocol is transmitted via hard wired, radio frequency, CEBus PLC, or Echelon PLC transmissions.

12. The modular meter-based utility gateway of claim 9, wherein said WAN interface card comprises a master microprocessor and said LAN interface cards comprise slave microprocessors, and said master microprocessor controls communications between said WAN interface card and said LAN interface cards via said data bus.

13. The modular meter-based utility gateway of claim 9, wherein said WAN interface card is enclosed in a first chamber having a first chamber access mechanism and said LAN interfaces cards are enclosed in a second chamber having a second chamber access mechanism.

14. The modular meter-based utility gateway of claim 13, wherein said first chamber access mechanism provides a first level of security for access to said first chamber and said second chamber provides a second level of security for access to said second chamber.

* * * * *